United States Patent
Wang et al.

(10) Patent No.: US 10,361,209 B2
(45) Date of Patent: Jul. 23, 2019

(54) SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujan Province (CN)

(72) Inventors: Ying-Chiao Wang, Changhua County (TW); Li-Wei Feng, Kaohsiung (TW); Chien-Ting Ho, Taichung (TW); Wen-Chieh Lu, Taoyuan (TW); Li-Wei Liu, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/043,166

(22) Filed: Jul. 24, 2018

(65) Prior Publication Data
US 2018/0350817 A1 Dec. 6, 2018

Related U.S. Application Data

(63) Continuation of application No. 15/479,294, filed on Apr. 5, 2017, now Pat. No. 10,074,656.

(30) Foreign Application Priority Data

Mar. 9, 2017 (CN) .......................... 2017 1 0137051

(51) Int. Cl.
*H01L 27/108* (2006.01)

(52) U.S. Cl.
CPC .. *H01L 27/10885* (2013.01); *H01L 27/10814* (2013.01); *H01L 27/10855* (2013.01);
(Continued)

(58) Field of Classification Search
CPC ......... H01L 27/10885; H01L 27/10894; H01L 27/10888; H01L 27/10897; H01L 27/10814
See application file for complete search history.

(56) References Cited

U.S. PATENT DOCUMENTS 6,093,612 A 7/2000 Suh
6,492,245 B1 12/2002 Liu
(Continued)

FOREIGN PATENT DOCUMENTS

| CN | 104347592 A | 2/2015 |
|---|---|---|
| CN | 105719998 A | 6/2016 |
| KR | 10-2014-0083737 A | 7/2014 |

*Primary Examiner* — Ismail A Muse
*Assistant Examiner* — Charles N Ausar-El
(74) *Attorney, Agent, or Firm* — Winston Hsu

(57) ABSTRACT

A manufacturing method of a semiconductor memory device includes following steps. Bit line structures and storage node contacts are formed on a semiconductor substrate. A first sidewall spacer is formed on sidewalls of each bit line structure. A conductive layer covering the bit line structures, the first sidewall spacer, and the storage node contacts is formed. A first patterning process is preformed to the conductive layer for forming stripe contact structures. Each stripe contact structure is elongated in the first direction and corresponding to the storage node contacts. The first sidewall spacer at a first side of each bit line structure is exposed by the first patterning process. The first sidewall spacer at a second side of each bit line structure is covered by the stripe contact structures. The first sidewall spacer exposed by the first patterning process is removed for forming first air spacers.

6 Claims, 15 Drawing Sheets

(52) U.S. Cl.
CPC .. *H01L 27/10888* (2013.01); *H01L 27/10894* (2013.01); *H01L 27/10897* (2013.01)

(56) References Cited

U.S. PATENT DOCUMENTS

| | | | |
|---|---|---|---|
| 6,787,469 B2* | 9/2004 | Houston | H01L 21/32139 257/E21.314 |
| 7,741,663 B2* | 6/2010 | Hause | H01L 29/41775 257/288 |
| 8,344,517 B2* | 1/2013 | Kim | H01L 21/7682 257/774 |
| 8,436,410 B2 | 5/2013 | Kang | |
| 8,962,472 B2* | 2/2015 | Rho | H01L 29/92 438/626 |
| 9,123,550 B2* | 9/2015 | Son | H01L 21/7682 |
| 9,165,820 B2 | 10/2015 | Kim | |
| 9,202,774 B2* | 12/2015 | Yeom | H01L 23/48 |
| 9,214,382 B2* | 12/2015 | Lee | H01L 21/764 |
| 9,252,233 B2* | 2/2016 | Hsiao | H01L 29/515 |
| 9,257,297 B2 | 2/2016 | Gwak | |
| 9,257,437 B2* | 2/2016 | Park | H01L 27/10885 |
| 9,293,362 B2* | 3/2016 | Lee | H01L 23/535 |
| 9,318,379 B2 | 4/2016 | Lee | |
| 9,318,382 B2 | 4/2016 | Kim | |
| 9,337,203 B2* | 5/2016 | Hwang | H01L 21/02164 |
| 9,356,073 B1 | 5/2016 | Kim | |
| 9,362,355 B1* | 6/2016 | Cheng | H01L 29/66742 |
| 9,368,572 B1* | 6/2016 | Cheng | H01L 29/7827 |
| 9,379,002 B2* | 6/2016 | Han | H01L 21/764 |
| 9,379,004 B1 | 6/2016 | Kwon | |
| 9,412,659 B1* | 8/2016 | Zang | H01L 29/4991 |
| 9,418,998 B2* | 8/2016 | Kim | H01L 27/76895 |
| 9,425,200 B2* | 8/2016 | Hwang | H01L 27/10888 |
| 9,466,603 B2 | 10/2016 | Yeom | |
| 9,472,644 B2* | 10/2016 | Sung | H01L 29/6656 |
| 9,536,982 B1* | 1/2017 | Cheng | H01L 29/41791 |
| 9,601,420 B2 | 3/2017 | Hwang | |
| 9,608,065 B1 | 3/2017 | Bergendahl | H01L 27/0886 |
| 9,620,451 B2* | 4/2017 | Hwang | H01L 21/02164 |
| 9,627,253 B2 | 4/2017 | Kim | |
| 9,704,988 B2 | 7/2017 | Oh | |
| 9,786,598 B2* | 10/2017 | Kim | H01L 21/764 |
| 9,786,760 B1* | 10/2017 | Bonilla | H01L 29/4991 |
| 9,818,843 B2 | 11/2017 | Oh | |
| 9,837,490 B2 | 12/2017 | Park | |
| 9,859,283 B1 | 1/2018 | Feng | |
| 9,929,162 B1 | 3/2018 | Feng | |
| 9,960,167 B1 | 5/2018 | Ho | |
| 10,141,200 B2* | 11/2018 | Byun | H01L 21/28132 |
| 10,249,728 B2* | 4/2019 | Chanemougame | H01L 29/4991 |
| 2005/0280000 A1* | 12/2005 | Ishii | G11C 11/405 257/67 |
| 2007/0184615 A1 | 8/2007 | Brazzelli | |
| 2009/0065814 A1* | 3/2009 | Bhalla | H01L 29/1083 257/230 |
| 2009/0065855 A1* | 3/2009 | Bhalla | H01L 29/1095 257/328 |
| 2009/0065861 A1* | 3/2009 | Bhalla | H01L 29/1095 257/331 |
| 2010/0295113 A1 | 11/2010 | Kang | |
| 2012/0049265 A1 | 3/2012 | Yoo | |
| 2012/0104512 A1* | 5/2012 | Horak | H01L 29/4983 257/401 |
| 2012/0199886 A1* | 8/2012 | Horak | H01L 21/76897 257/288 |
| 2012/0276711 A1 | 11/2012 | Yoon | |
| 2013/0034587 A1* | 2/2013 | Brin | A61K 38/4893 424/239.1 |
| 2013/0049132 A1* | 2/2013 | Doris | H01L 21/7682 257/383 |
| 2013/0248950 A1 | 9/2013 | Kang | |
| 2013/0292847 A1 | 11/2013 | Choi | |
| 2014/0077305 A1* | 3/2014 | Pethe | H01L 21/76895 257/368 |
| 2014/0138779 A1* | 5/2014 | Xie | H01L 29/66545 257/401 |
| 2014/0175659 A1 | 6/2014 | Lee | |
| 2014/0179101 A1 | 6/2014 | Lee | |
| 2014/0187037 A1* | 7/2014 | Rho | H01L 29/92 438/626 |
| 2014/0246724 A1 | 9/2014 | Jang | |
| 2014/0264729 A1 | 9/2014 | Lee | |
| 2014/0306351 A1 | 10/2014 | Kim | |
| 2014/0327063 A1 | 11/2014 | Park | |
| 2015/0014759 A1 | 1/2015 | Lee | |
| 2015/0035050 A1 | 2/2015 | Yeom | |
| 2015/0056801 A1 | 2/2015 | Park | |
| 2015/0061134 A1* | 3/2015 | Lee | H01L 21/764 257/751 |
| 2015/0061154 A1 | 3/2015 | Choi | |
| 2015/0126013 A1 | 5/2015 | Hwang | |
| 2015/0214113 A1* | 7/2015 | Bouche | H01L 21/823431 438/283 |
| 2015/0214146 A1 | 7/2015 | Kim | |
| 2015/0214220 A1 | 7/2015 | Seo | |
| 2015/0214291 A1 | 7/2015 | Park | |
| 2015/0228754 A1 | 8/2015 | Sung | |
| 2015/0243544 A1* | 8/2015 | Alptekin | H01L 21/7682 438/586 |
| 2015/0255466 A1 | 9/2015 | Hwang | |
| 2015/0262625 A1 | 9/2015 | Han | |
| 2015/0333069 A1* | 11/2015 | Kim | H01L 27/10814 257/334 |
| 2015/0333071 A1* | 11/2015 | Kim | H01L 27/10855 438/510 |
| 2016/0027727 A1* | 1/2016 | Kim | H01L 21/764 257/774 |
| 2016/0035676 A1* | 2/2016 | Im | H01L 27/10855 257/306 |
| 2016/0035731 A1 | 2/2016 | Lee | |
| 2016/0043171 A1 | 2/2016 | Jang | |
| 2016/0064384 A1 | 3/2016 | Park | |
| 2016/0086955 A1 | 3/2016 | Wu | |
| 2016/0093717 A1* | 3/2016 | Oh | H01L 29/4236 438/270 |
| 2016/0111515 A1* | 4/2016 | Besser | H01L 29/4991 |
| 2016/0172363 A1* | 6/2016 | Doebler | H01L 21/31144 257/296 |
| 2016/0181143 A1 | 6/2016 | Kwon | |
| 2016/0211215 A1* | 7/2016 | Lee | H01L 23/5222 |
| 2016/0307900 A1 | 10/2016 | Kim | |
| 2016/0322365 A1 | 11/2016 | Kim | |
| 2016/0365426 A1* | 12/2016 | Ching | H01L 29/66545 |
| 2016/0380060 A1 | 12/2016 | Kim | |
| 2017/0005097 A1 | 1/2017 | Kim | |
| 2017/0005166 A1 | 1/2017 | Park | |
| 2017/0062347 A1 | 3/2017 | Kim | |
| 2017/0084710 A1 | 3/2017 | Koh | |
| 2017/0125283 A1 | 5/2017 | Lee | |
| 2017/0125530 A1* | 5/2017 | Zhang | H01L 29/41791 |
| 2017/0133262 A1 | 5/2017 | Lee | |
| 2017/0194423 A1* | 7/2017 | Lin | G02B 26/101 |
| 2017/0338317 A1 | 11/2017 | Kim | |
| 2018/0097059 A1* | 4/2018 | Bi | H01L 29/0649 |

* cited by examiner

SEMICONDUCTOR MEMORY DEVICE

CROSS REFERENCE TO RELATED APPLICATIONS

This application is a continuation of application Ser. No. 15/479,294 filed on Apr. 5, 2017, now allowed, which is incorporated by reference herein in its entirety.

BACKGROUND OF THE INVENTION

1. Field of the Invention

The present invention relates to a semiconductor memory device and a manufacturing method thereof, and more particularly, to a semiconductor memory device including air spacers and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

According to demands of products, the need to continuously increase the density of the memory cells in the array leads to more difficult and complex processes and design. For example, when the density of the memory cells increases, the distance between components in the memory cell becomes smaller and the influence of parasite capacitance becomes more obvious. Therefore, the related industries keep making efforts to design new structures and/or processes in order to reduce the parasite capacitance for improving the performance of the memory device.

SUMMARY OF THE INVENTION

It is one of the objectives of the present invention to provide a semiconductor memory device and a manufacturing method thereof. The formation condition of air spacers may be ensured by forming the air spacers before a step of forming storage node contact pads. The purposes of enhancing manufacturing yield and improving operation performance of the device may be achieved accordingly.

A manufacturing method of a semiconductor memory device is provided in an embodiment of the present invention. The manufacturing method includes the following steps. A semiconductor substrate is provided first. A plurality of bit line structures is formed on the semiconductor substrate. Each of the bit line structures is elongated in a first direction. A first sidewall spacer is formed on sidewalls of each of the bit line structures. A plurality of storage node contacts is formed on the semiconductor substrate. A conductive layer covering the bit line structures, the first sidewall spacer, and the storage node contacts is formed. A first patterning process is preformed to the conductive layer for forming a plurality of stripe contact structures. Each of the stripe contact structures is elongated in the first direction and formed corresponding to a plurality of the storage node contacts. The first sidewall spacer formed at a first side of each of the bit line structures in a second direction is exposed by the first patterning process, and the first sidewall spacer formed at a second side of each of the bit line structures which is opposite to the first side in the second direction is covered by the stripe contact structures. The first sidewall spacer exposed by the first patterning process is removed for forming a plurality of first air spacers.

A semiconductor memory device is provided by an embodiment of the present invention. The semiconductor memory device includes a semiconductor substrate, a plurality of bit line structures, a plurality of storage node contacts, a plurality of first air spacers, a plurality of first sidewall spacers, a plurality of second sidewall spacers, and a plurality of third sidewall spacers. The bit line structures are disposed on the semiconductor substrate. Each of the bit line structures is elongated in a first direction, and the bit line structures are repeatedly disposed in a second direction. The storage node contacts are disposed on the semiconductor substrate. Each of the storage node contacts is disposed between the bit line structures adjacent to one another in the second direction. Each of the first air spacers is disposed at a first side of each of the bit line structures in the second direction, and each of the first air spacers is disposed between one of the bit line structures and the storage node contact adjacent to the bit line structure. Each of the first sidewall spacers is disposed at a second side of each of the bit line structures, and the second side is opposite to the first side in the second direction. Each of the first sidewall spacers is disposed between one of the bit line structures and the storage node contact adjacent to the bit line structure. Each of the second sidewall spacers and each of the third sidewall spacers are disposed at the first side and the second side of each of the bit line structures. Each of the first sidewall spacers is disposed between one of the second sidewall spacers disposed at the second side and one of the third sidewall spacers disposed at the second side. Each of the first air spacers is disposed between one of the second sidewall spacers disposed at the first side and one of the third sidewall spacers disposed at the first side.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-13 are schematic drawings illustrating a manufacturing method of a semiconductor memory device according to a first embodiment of the present invention, wherein FIG. 2 is a cross-sectional diagram illustrating bit line structures under the condition of FIG. 1, FIG. 3 is a schematic drawing in a step subsequent to FIG. 1, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a cross-sectional diagram illustrating the bit line structures under the condition of FIG. 6, FIG. 8 is a schematic drawing in a step subsequent to FIG. 7, FIG. 9 is a top view diagram illustrating the condition of FIG. 8, FIG. 10 is a schematic drawing in a step subsequent to FIG. 6, FIG. 11 is a schematic drawing in a step subsequent to FIG. 10, FIG. 12 is a cross-sectional diagram illustrating the bit line structures under the condition of FIG. 11, and FIG. 13 is a top view diagram illustrating the condition of FIG. 12.

DETAILED DESCRIPTION

Figure 1:
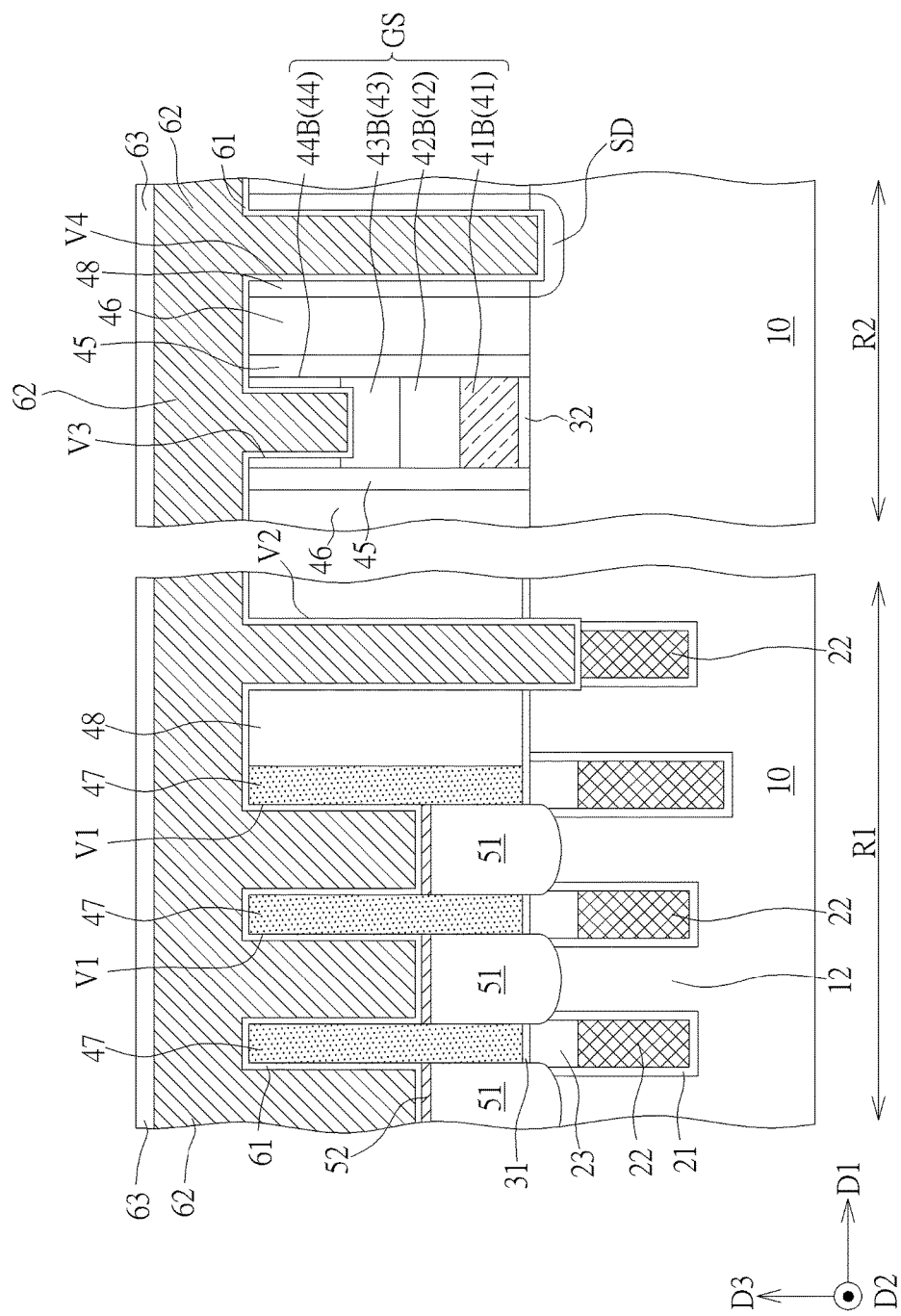
Figure 2:
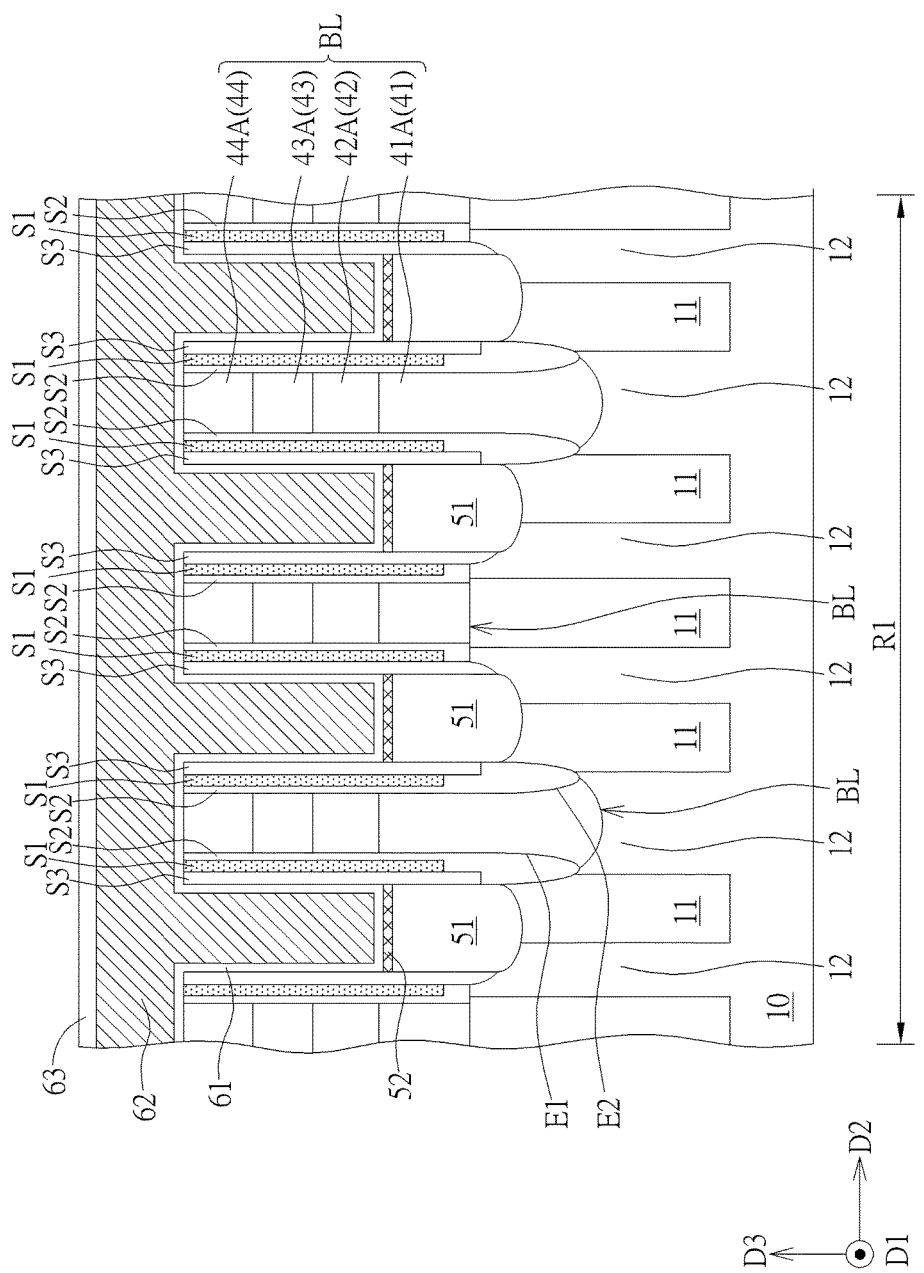

Please refer to FIGS. 1-13. FIGS. 1-13 are schematic drawings illustrating a manufacturing method of a semiconductor memory device according to a first embodiment of the present invention. FIGS. 1, 3-6, 10, and 11 are schematic drawings illustrating conditions in a memory cell region and a peripheral region. FIGS. 2, 7, 8, and 12 are cross-sectional diagrams illustrating bit line structures and taken along a direction perpendicular to an elongation direction of the bit line structures. FIG. 9 and FIG. 13 are top view diagrams. Additionally, FIG. 8 may be regarded as a cross-sectional diagram taken along a line A-A' in FIG. 9, and FIG. 12 may be regarded as a cross-sectional diagram taken along a line B-B' in FIG. 13, but not limited thereto. The manufacturing method of the semiconductor memory device in this embodiment includes the following steps. As shown in FIG. 1 and FIG. 2, a semiconductor substrate 10 is provided first. A memory cell region R1 and a peripheral region R2 may be defined on the semiconductor substrate 10. A plurality of memory cells may be formed in the memory cell region R1, and other units other than the memory cells may be formed in the peripheral region R2, such as transistors configured to control signals transmitted by word lines and/orbit lines, but not limited thereto. The semiconductor substrate 10 may include silicon substrate, epitaxial silicon substrate, silicon germanium substrate, silicon carbide substrate or silicon-on-insulator (SOI) substrate, but not limited thereto. In this embodiment, a shallow trench isolation 11 may be formed in the memory cell region R1 of the semiconductor substrate 10 for defining a plurality of active areas 12 in the memory cell region R1 of the semiconductor substrate 10. Additionally, a plurality of word lines 22 may be formed in the memory cell region R1 of the semiconductor substrate 10, and the word lines 22 in this embodiment may be buried word lines, but not limited thereto. The word lines 22 may be formed in the semiconductor substrate 10 by a buried configuration, a word line dielectric layer 21 may be formed between each of the word lines 22 and the semiconductor substrate 10, and a word line cap layer 23 may be formed above and cover the word lines 22. The word line dielectric layer 21, the word lines 22, and the word line cap layer 23 as mentioned above may be formed by forming a plurality of trenches in the semiconductor substrate 10 and forming the word line dielectric layer 21, the word lines 22, and the word line cap layer 23 in the trenches, but not limited thereto. In some embodiments, other kinds of the word line structures may also be applied according to other considerations. In addition, the word line dielectric layer 21 may include silicon oxide or other suitable dielectric materials, the word lines 22 may include aluminum, tungsten, copper, titanium aluminide (TiAl), or other suitable conductive materials, and the word line cap layer 23 may include silicon nitride, silicon oxynitride, silicon carbonitride, or other suitable insulation materials.

A plurality of bit line structures BL and at least one gate structure GS are then formed on the semiconductor substrate 10. Each of the bit line structures BL is elongated in a first direction D1, and the bit line structures BL may be repeatedly disposed and arranged in a second direction D2. In some embodiments, the bit line structures BL and the gate structure GS may be formed in the memory cell region R1 and the peripheral region R2 respectively by patterning a stack structure including multiple layers, but the present invention is not limited to this. The bit line structures BL and the gate structure GS may be also be formed by different processes and/or different materials according to other considerations. For instance, a stack structure including a non-metal conductive layer 41, a barrier layer 42, a metal layer 43, and a cap layer 44 stacked sequentially may be formed on the semiconductor substrate 10, and the stack structure may be patterned for forming the bit line structures BL and the gate structure GS. The non-metal conductive layer 41 may include polysilicon, amorphous silicon, or other non-metal conductive layer including silicon or not. The barrier layer 42 may include titanium, tungsten silicide (WSi), tungsten nitride (WN), or other appropriate barrier materials. The metal layer 43 may include aluminum, tungsten, copper, titanium aluminide, or other suitable metal conductive materials with low electrical resistivity. The cap layer 44 may include silicon nitride, silicon oxynitride, silicon carbonitride, or other suitable insulation materials. Accordingly, each of the bit line structures BL may include a first non-metal conductive layer 41A, a first barrier layer 42A, a first metal layer 43A, and a bit line cap layer 44A stacked sequentially, and the gate structure GS may include a second non-metal conductive layer 41B, a second barrier layer 42B, a second metal layer 43B, and a gate cap layer 44B, but not limited thereto. Additionally, before the step of forming the stack structure mentioned above, an insulation layer 31 may be formed on the memory cell region R1 of the semiconductor substrate 10 and cover the word line cap layer 23 and the active areas 12, and a gate dielectric layer 32 may be formed on the peripheral region R2 of the semiconductor substrate 10 for being used as a gate insulation layer in a transistor corresponding to the gate structure GS, but not limited thereto.

Dielectric layers, such as a first dielectric layer 45 and a second dielectric layer 46 shown in FIG. 1, may be formed on the gate structure GS in the peripheral region R2, and spacers may be formed on sidewalls of the gate structure GS by etching the dielectric layers, but not limited thereto. Additionally, one or more spacers may be formed on sidewalls of each of the bit line structures BL. The spacers formed on the sidewalls of each of the bit line structures BL and the spacers formed on the sidewalls of the gate structure GS may be formed together by the same process or be formed respectively by different processes according to different considerations. In this embodiment a first sidewall spacer S1 may be formed on the sidewalls of each of the bit line structures BL. In some embodiments, a second sidewall spacer S2 and a third sidewall spacer S3 may be formed on the sidewalls of each of the bit line structures BL, but not limited thereto. The second sidewall spacer S2 is disposed between the first sidewall spacer S1 and each of the bit line structures BL, and the first sidewall spacer S1 is disposed between the second sidewall spacer S2 and the third sidewall spacer S3. In addition, a source/drain region SD may be formed in the semiconductor substrate 10, and a third dielectric layer 48 may be formed and cover the source/drain region SD, but not limited thereto.

As shown in FIG. 1 and FIG. 2, the manufacturing method in this embodiment may further include forming a plurality of storage node contacts 51 in the memory cell region R1, and each of the storage node contacts 51 is formed corresponding to and electrically connected to at least one of the active areas 12. The storage node contacts 51 may be formed by forming an isolation structure 47 including a plurality of openings on the semiconductor substrate 10, filling the openings of the isolation structure 47 with a conductive material, and performing an etching back process to the conductive material. Accordingly, a top surface of each of the storage node contacts 51 may be lower than a top surface of the isolation structure 47 in a vertical direction D3, and the top surface of each of the storage node contacts 51 may be higher than a top surface of the semiconductor substrate 10, but not limited thereto. The storage node contacts 51 may include silicon, such as polysilicon, amorphous silicon, or other conductive materials containing silicon. In some embodiments, the storage node contacts 51 may also be formed by other manufacturing methods and/or other materials according to other considerations. In addition, a metal silicide layer 52 may be formed on each of the storage node contacts 51 for lowering a contact resistance between each of the storage node contacts 51 and a conductive structure subsequently formed on the storage node contact 51, but not limited thereto.

A conductive layer 62 is then formed and covers the bit line structures BL, the first sidewall spacer S1, and the storage node contacts 51. Specifically, a plurality of first recesses V1 may be formed in the isolation structure 47 by the above mentioned etching back process of forming the storage node contacts 51, and each of the first recesses V1 may be formed corresponding to at least one of the storage node contacts 51 in the vertical direction D3. In some embodiments, the third dielectric layer 48 may be partly formed in the memory cell region R1, and a second recess V2 penetrating the third dielectric layer 48 and the insulation layer 31 may be formed and expose the corresponding word line 22 before the step of forming the conductive layer 62. In some embodiments, the conductive layer 62 may further cover the gate structure GS and the source/drain region SD, and a third recess V3 and a fourth recess V4 may be formed before the step of forming the conductive layer 62. The third recess V3 may penetrate the gate cap layer 44B and expose the second metal layer 43B in the gate structure GS, and the fourth recess V4 may penetrate the third dielectric layer 48 in the peripheral region R2 and expose a part of the source/drain region SD, but not limited thereto. In some embodiments, each of the first recesses V1, the second recess V2, the third recess V3, and the fourth recess V4 may be filled with the conductive layer 62, and a patterning process subsequently performed to the conductive layer 62 may be used to form storage contact pads, a word line contact structure, a gate contact structure, and a source/drain contact structure, but not limited thereto. Additionally, the conductive layer 62 may include aluminum, tungsten, copper, titanium aluminide, or other suitable metal conductive materials with low electrical resistivity, and a third barrier layer 61 may be formed before the step of forming the conductive layer 62 for keeping the material of the storage node contacts 51 from diffusing into the conductive layer 62, but not limited thereto. In some embodiments, a hard mask layer 63 may be formed on the conductive layer 62 for the subsequent patterning process, but not limited thereto.

Figure 3:
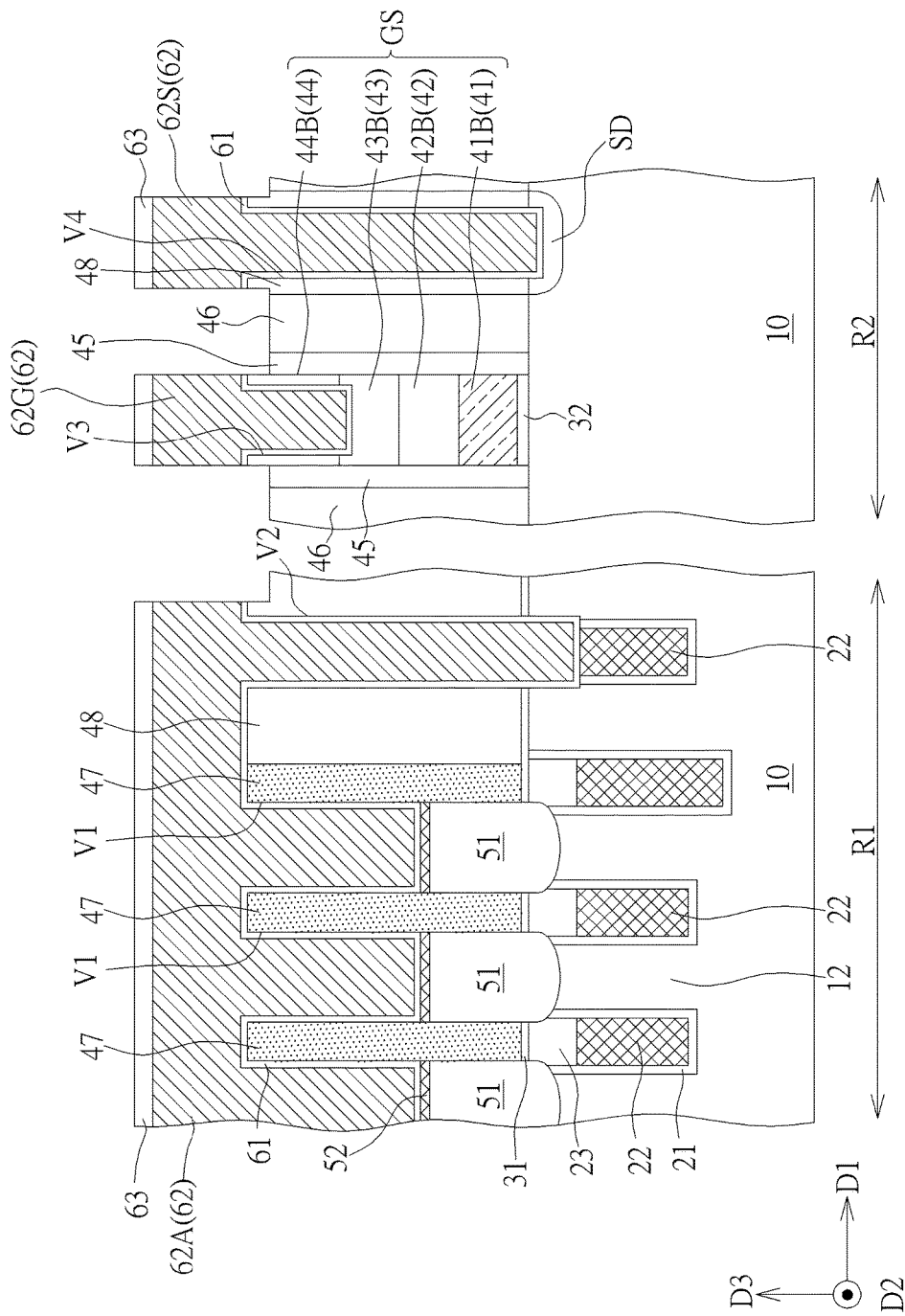

As shown in FIG. 3, a first patterning process is preformed to the conductive layer 62 for forming a plurality of stripe contact structures 62A. Each of the stripe contact structures 62A is elongated in the first direction D1 and formed corresponding to a plurality of the storage node contacts 51. In some embodiments, the first patterning process performed to the conductive layer 62 may also be used to form a word line contact structure 62C and form a gate contact structure 62G and a source/drain contact structure 62S in the peripheral region R2, but not limited thereto. In other words, the conductive layer 62 disposed on the gate structure GS may be patterned by the first patterning process for forming the gate contact structure 62G, and the conductive layer 62 disposed on the source/drain region SD may be patterned by the first patterning process for forming the source/drain contact structure 62S.

Figure 4:
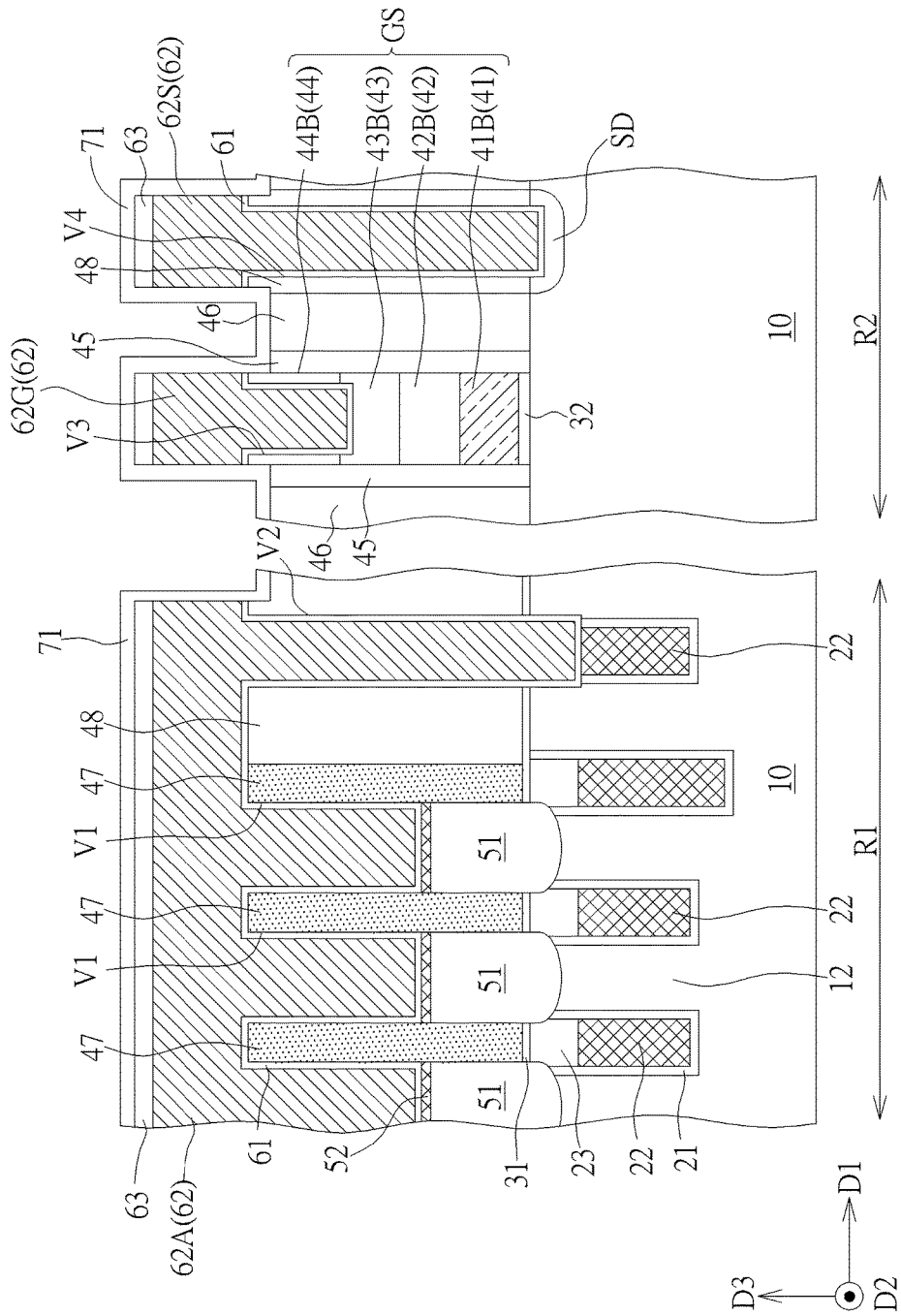
Figure 5:
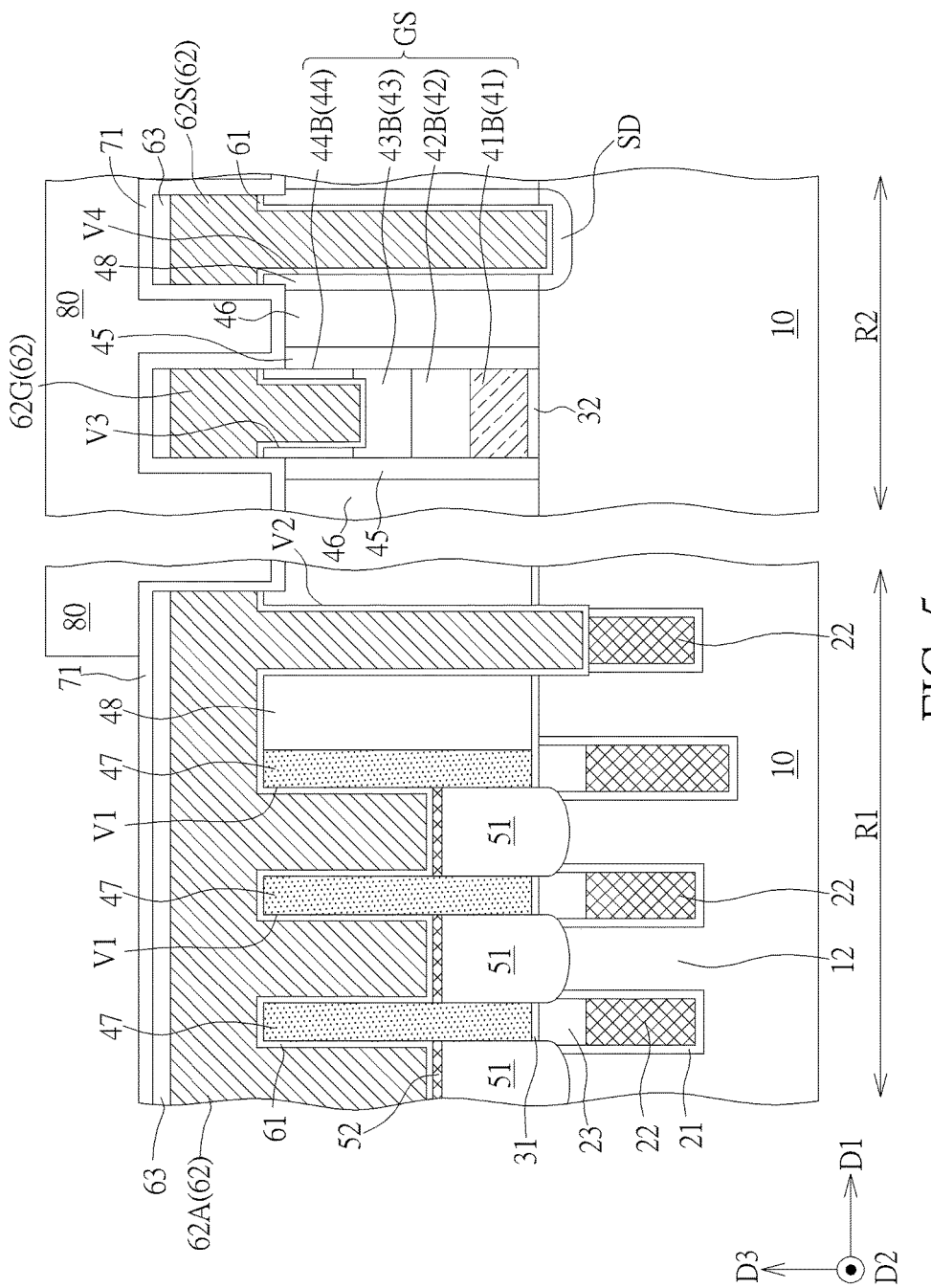
Figure 6:
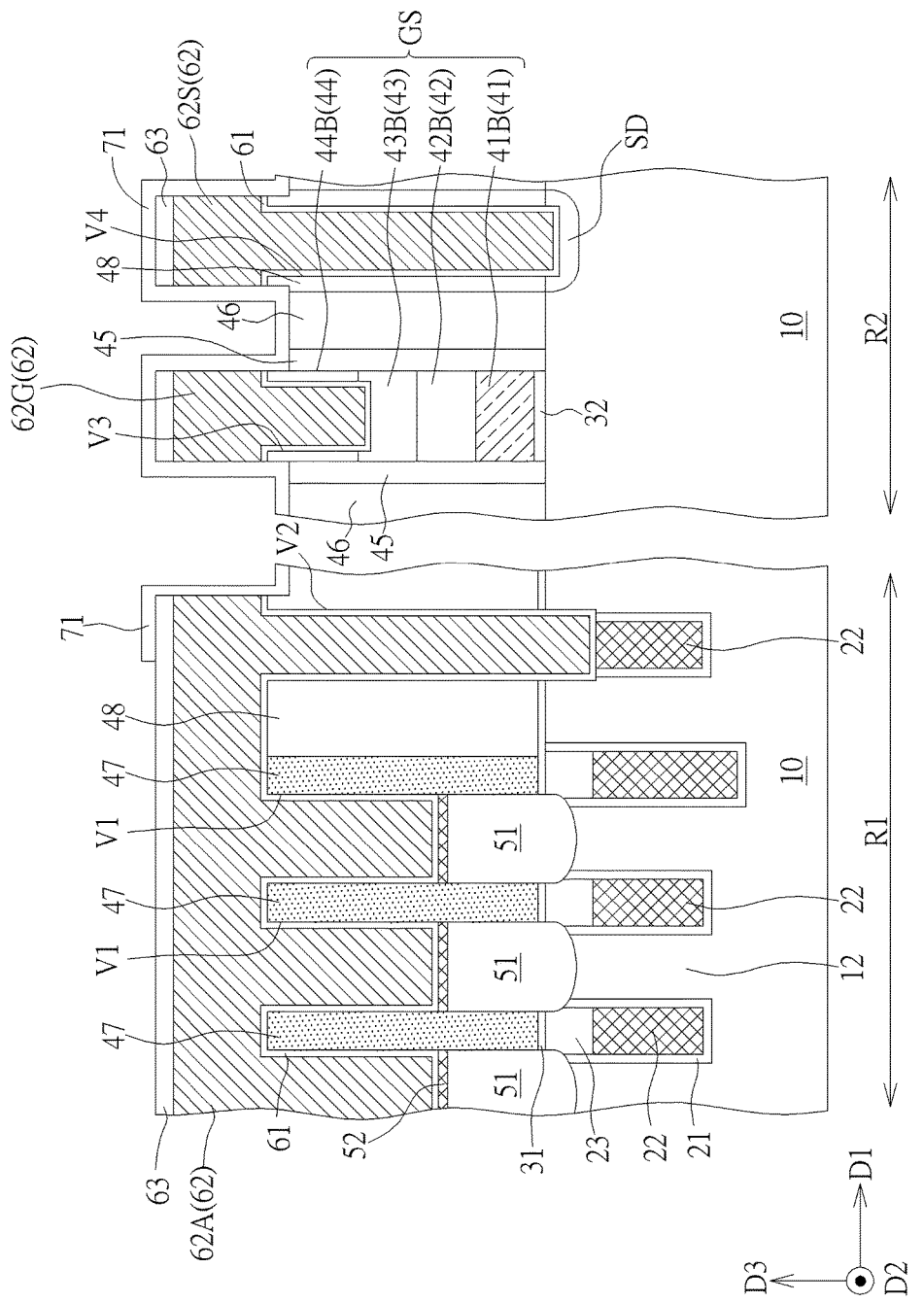
Figure 7:
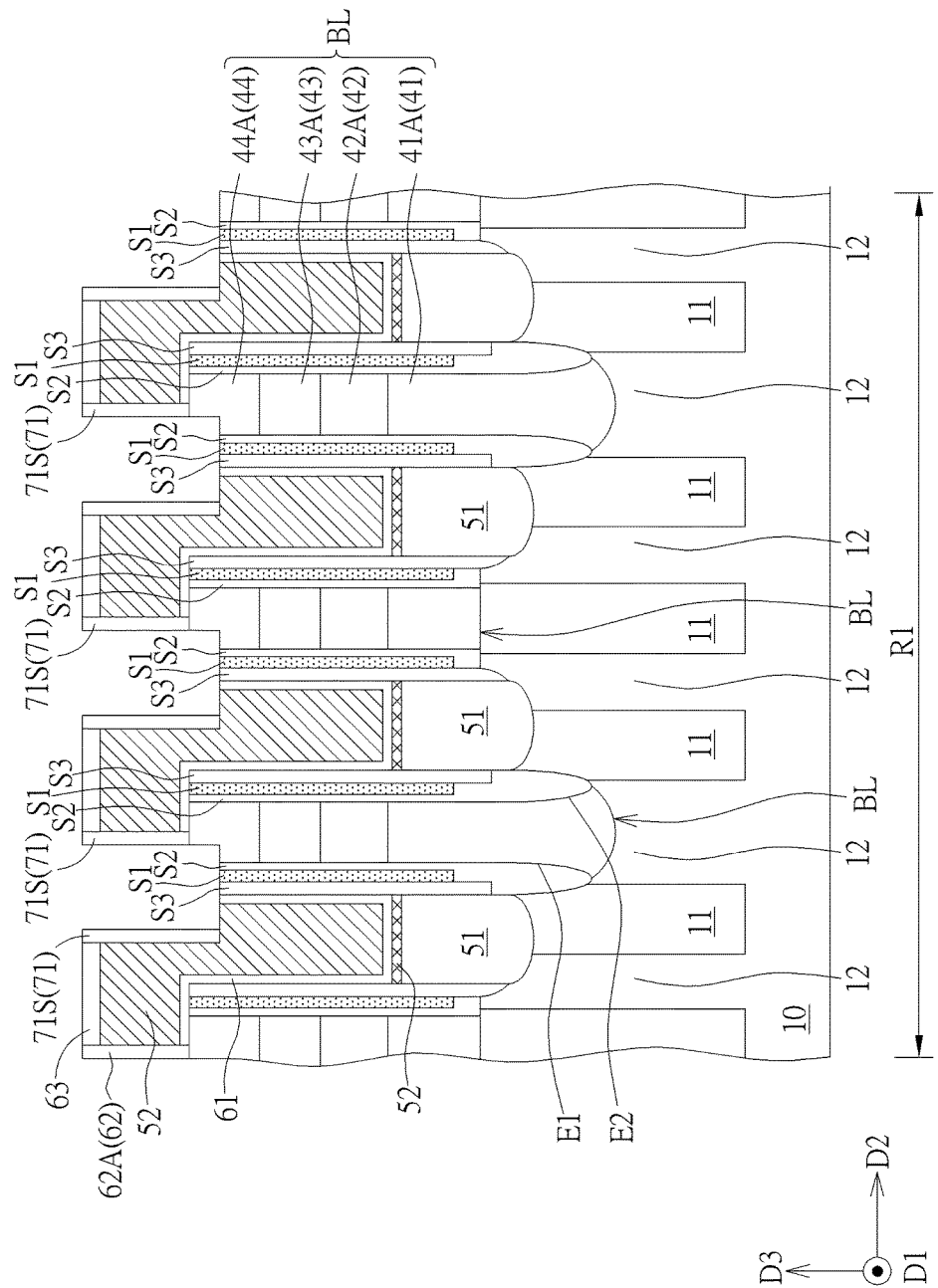

As shown in FIGS. 3-7, in some embodiments, the first patterning process may include but is not limited to the following steps. As shown in FIG. 3, the conductive layer 62 is etched for forming the stripe contact structures 62A. As shown in FIG. 4, a dielectric layer (such as a fourth dielectric layer 71 shown in FIG. 4) is then formed covering the stripe contact structures 62A after the step of forming the stripe contact structures 62A. In some embodiments, the fourth dielectric layer 71 may be formed in the memory cell region R1 and the peripheral region R2 completely, and the fourth dielectric layer 71 may cover the gate contact structure 62G and the source/drain contact structure 62S, but not limited thereto. As shown in FIGS. 5-7, an etching back process is then performed to the fourth dielectric layer 71 for exposing the first sidewall spacer S1 formed at a first side E1 of each of the bit line structures BL. In some embodiments, a patterned mask layer 80 may be formed and cover the peripheral region R2 before the etching back process, and a part of the patterned mask layer may further cover an edge part of the stripe contact structure 62A, but not limited thereto. The patterned mask layer 80 may be used to protect the components in the peripheral region R2 from the influence of the etching back process of the fourth dielectric layer, and the patterned mask layer 80 may be removed after the etching back process.

Additionally, in some embodiments, a top portion of each of the stripe contact structures 62A may be slightly dislocated to the corresponding storage node contact 51 in the vertical direction D3. Therefore, the first sidewall spacer S1 formed at the first side E1 of each of the bit line structures BL in the second direction D2 is exposed by the first patterning process, and the first sidewall spacer S1 formed at a second side E2 of each of the bit line structures BL which is opposite to the first side E1 in the second direction D2 is covered by the stripe contact structures 62A. In some embodiments, the top portions of the stripe contact structures 62A may cover the first sidewall spacer 51, the second sidewall spacer S2, and the third sidewall spacer S3 which are formed at the second side E2 of each of the bit line structures BL in the vertical direction D3. The first sidewall spacer S1, the second sidewall spacer S2, and the third sidewall spacer S3 formed at the first side E1 of each of the bit line structures BL are not covered by the stripe contact structures 62A in the vertical direction D3. Therefore, after the etching back process performed to the fourth dielectric layer 71, the first sidewall spacer S1, the second sidewall spacer S2, and the third sidewall spacer S3 formed at the first side E1 of each of the bit line structures BL will be exposed, but not limited thereto. In addition, a fourth sidewall spacer 71S may be formed on sidewalls of each of the stripe contact structures 62A by the etching back process performed to the fourth dielectric layer 71, but not limited thereto.

Figure 8:
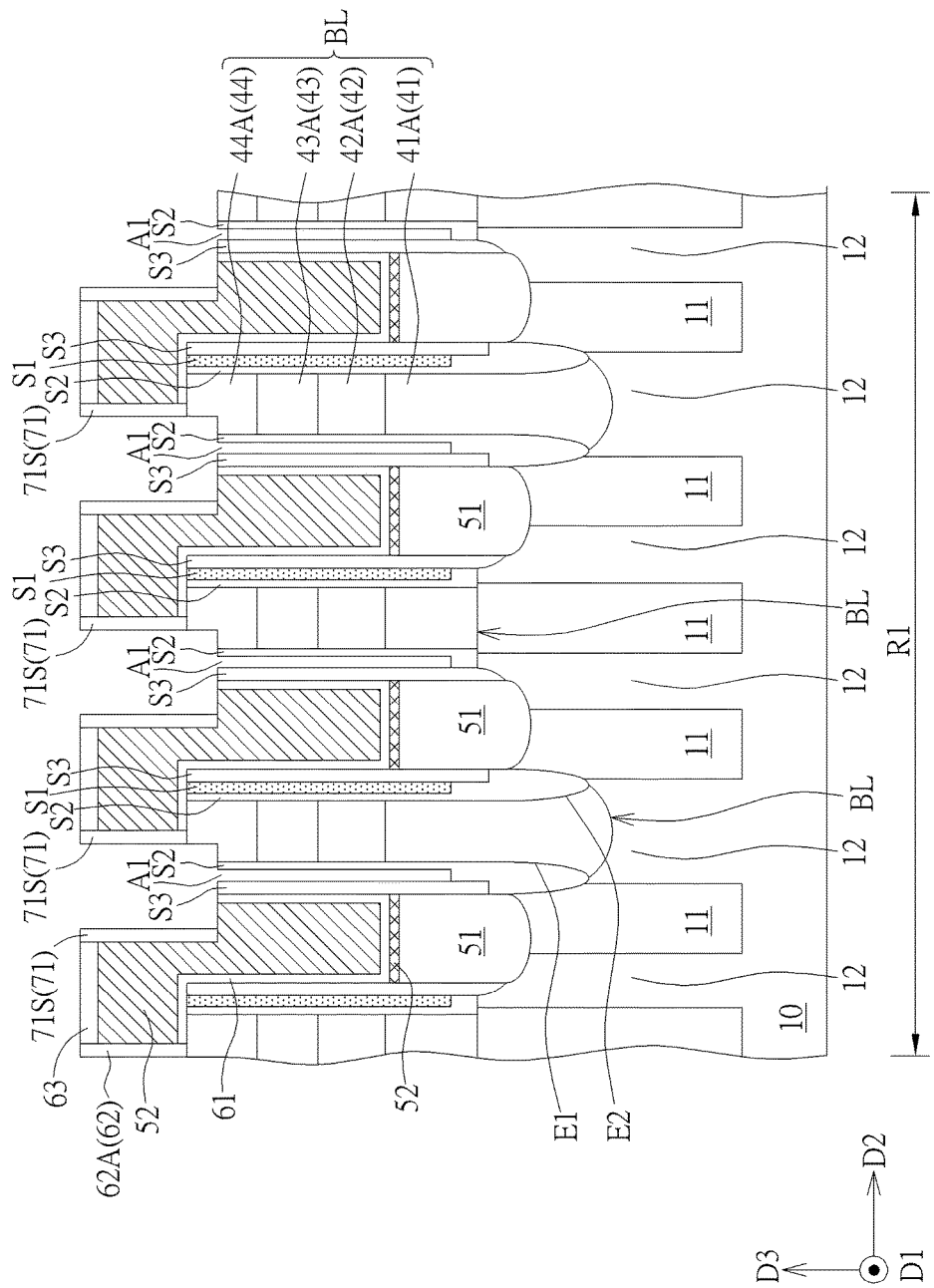
Figure 9:
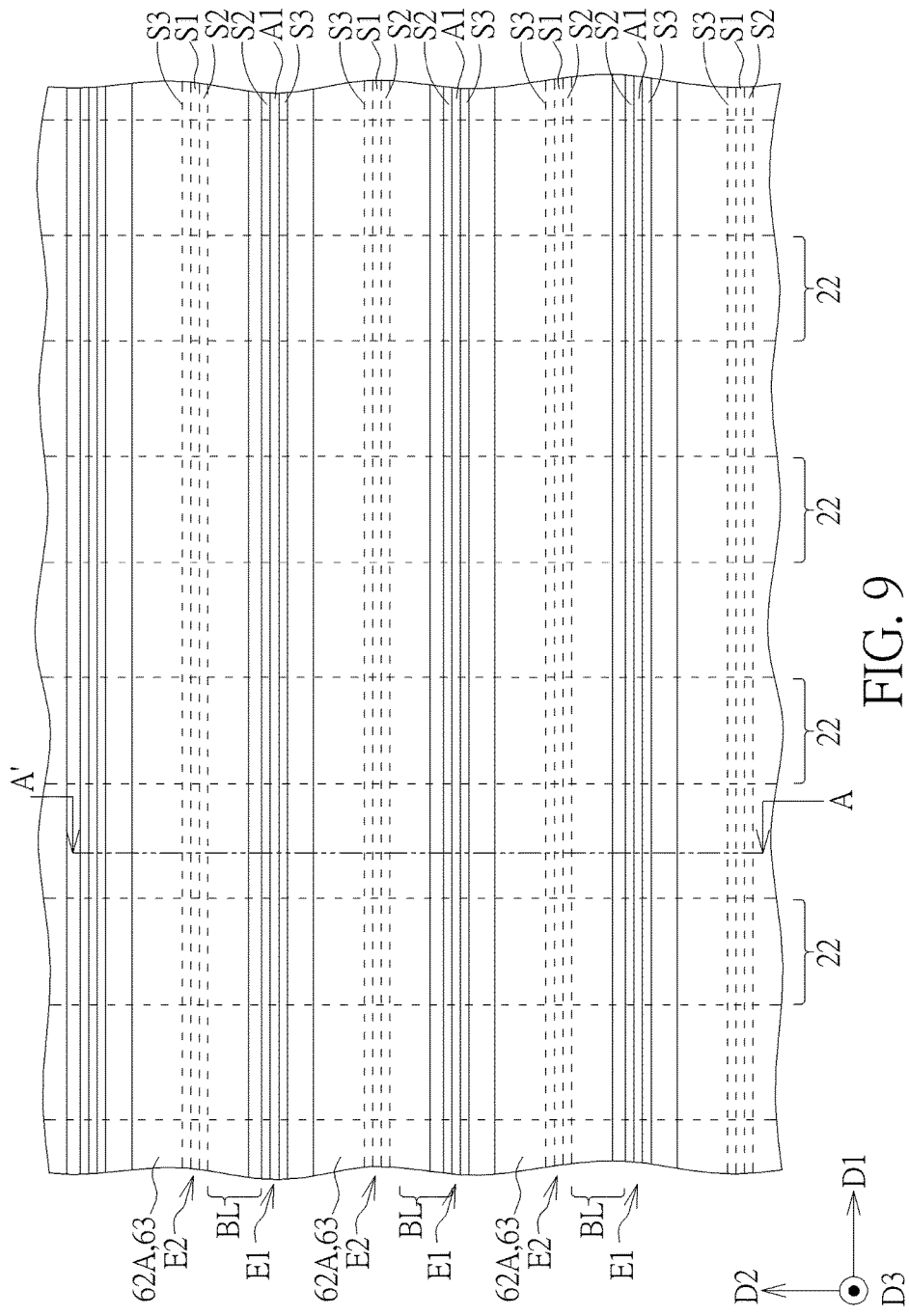

As shown in FIGS. 7-9, the first sidewall spacer S1 exposed by the first patterning process is then removed for forming a plurality of first air spacers A1. The first sidewall spacer S1 may be removed by an etching process with higher etching selectivity, such as a wet etching process, but not limited thereto. In some embodiments, other suitable etching processes may also be used to remove the first sidewall spacer S1 according to other considerations. Additionally, the second sidewall spacer S2 and the third sidewall spacer S3 adjacent to the first sidewall spacer S1 may be formed by materials with high etching selectivity to the material of the first sidewall spacer S1 preferably. In other words, the material of the first sidewall spacer S1 may be different from the material of the second sidewall spacer S2 and the material of the third sidewall spacer S3. For example, the first sidewall spacer S1 may include an oxide spacer, and the second sidewall spacer S2 and the third sidewall spacer S3 may include a nitride spacer respectively, but not limited thereto. Because the first sidewall spacer S1 formed at the first side E1 of each of the bit line structures BL is not covered by the stripe contact structures 62A, the etching process mentioned above may be used to remove the first sidewall spacer S1 formed at the first side E1 of each of the bit line structures BL effectively and form the first air spacer A1 even if the density of the memory cells increases and the thickness of the first sidewall spacer S1 in the second direction D2 has to be reduced. When the first sidewall spacer S1 is partially covered by other components in a wet etching process and the first sidewall spacer S1 has to be etched by side etching effect of the wet etching process for forming the air spacer, there will be some problems such as under etching and/or longer etching time, and these problems may be avoided by the manufacturing method of the present invention. Each of the first air spacers A1 is elongated in the first direction D1 and disposed between the corresponding bit line structure BL and a plurality of storage node contacts 51 arranged in the first direction D1 for effectively reducing the parasite capacitance of the bit line structure BL. Accordingly, the purposes of enhancing manufacturing yield and improving device operation performance may be achieved by the design of the present invention.

Figure 10:
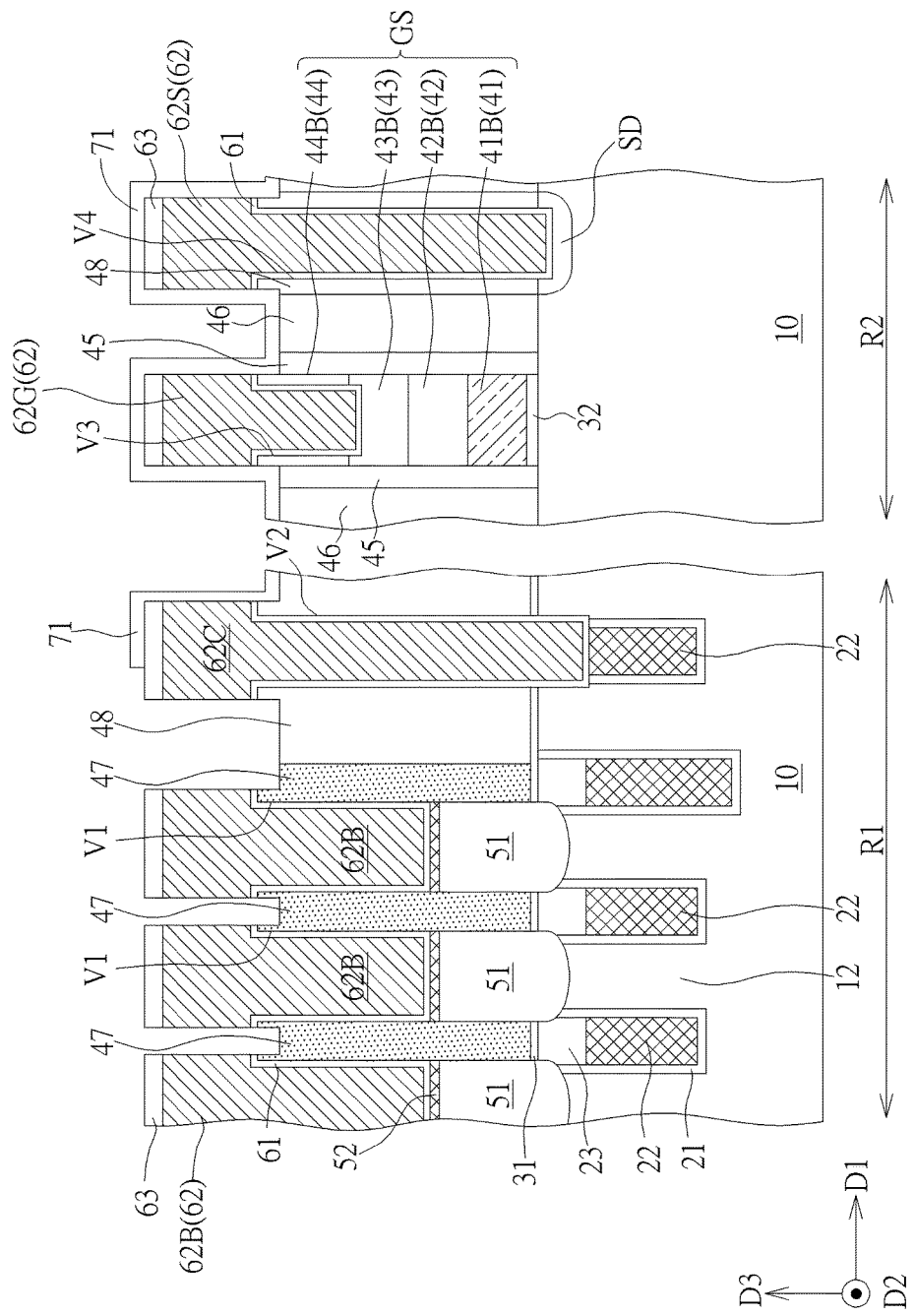

As shown in FIGS. 8-10, after the step of forming the first air spacers A1, a second patterning process may be performed to the stripe contact structures 62A for forming a plurality of storage node contact pads 62B. In some embodiments, each of the storage node contact pads 62B is formed corresponding to one of the storage node contacts 51, and each of the storage node contact pads 62B is electrically connected with the corresponding storage node contact 51, but not limited thereto. As shown in FIGS. 10-13, a fifth dielectric layer 72 may be formed and cover the storage node contact pads 62B, the space between the storage node contact pads 62B may be filled with the fifth dielectric layer 72, and the fifth dielectric layer 72 and the hard mask layer 63 on the storage node contact pads 62B in the vertical direction D3 may be removed by an etching back process for exposing the storage node contact pads 62B. The fifth dielectric layer 72 may be formed by a material and/or a process with worse gap-fill ability for ensuring that the fifth dielectric layer 72 is not formed in the first air spacers A1.

Figure 11:
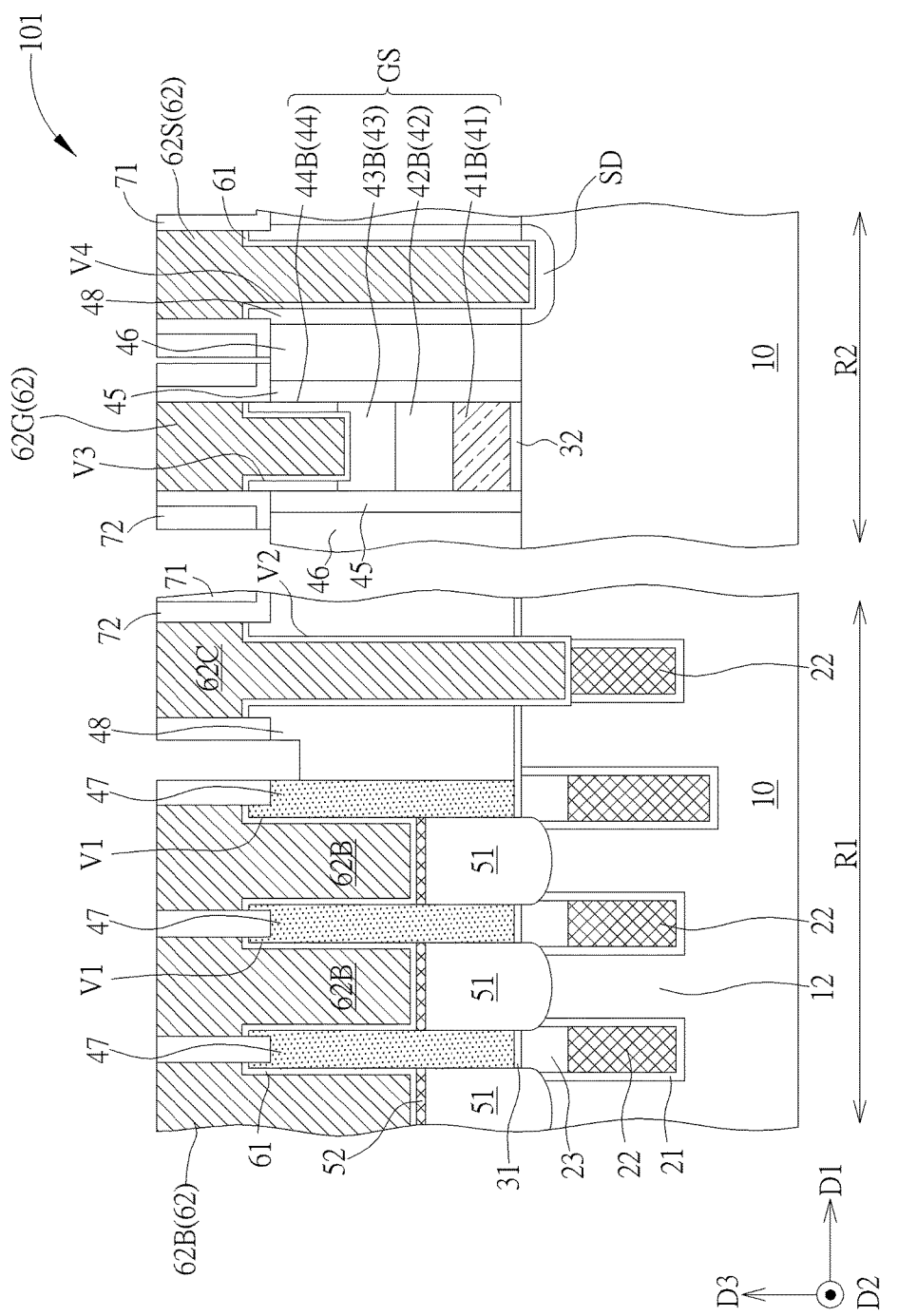
Figure 12:
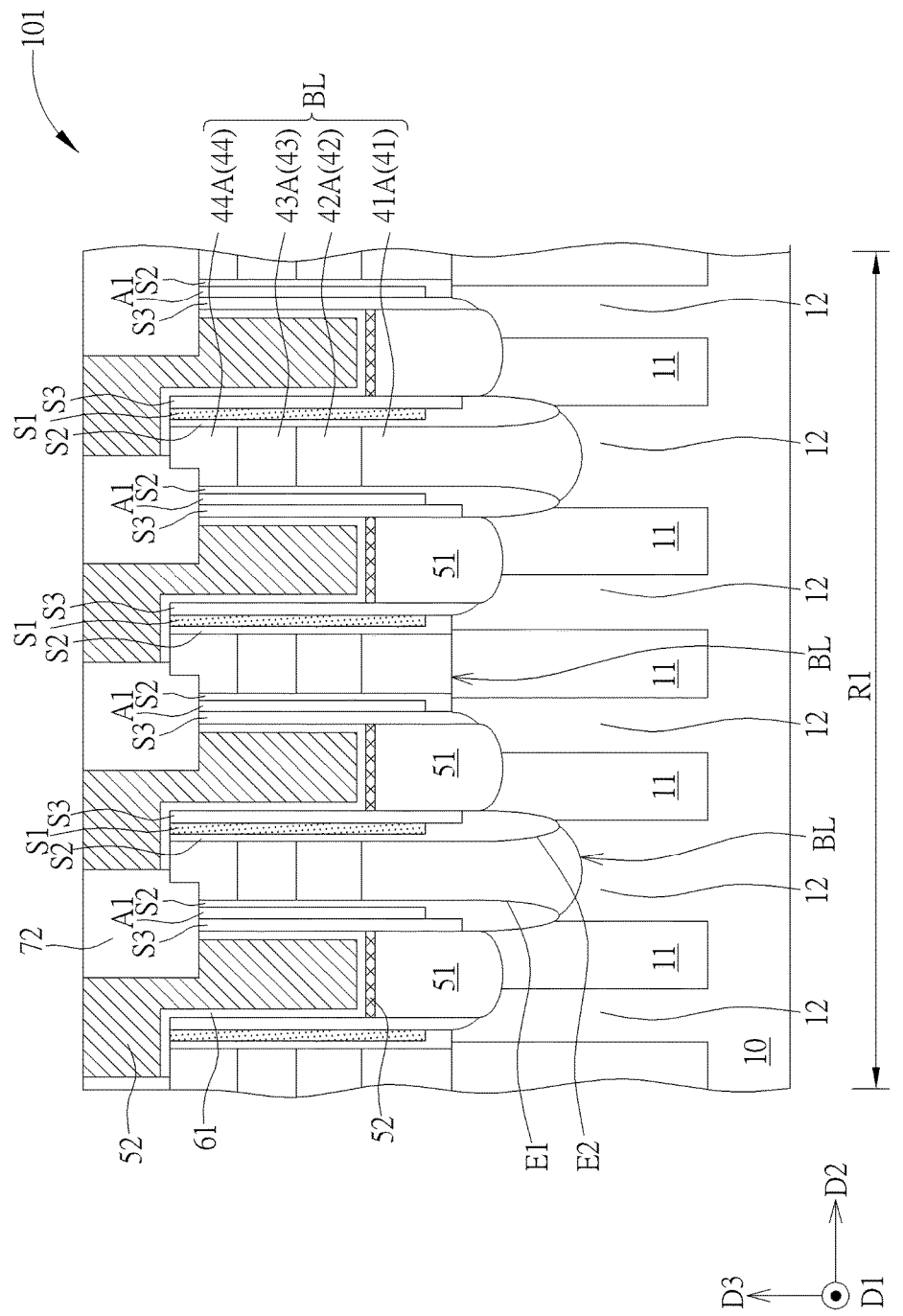
Figure 13:
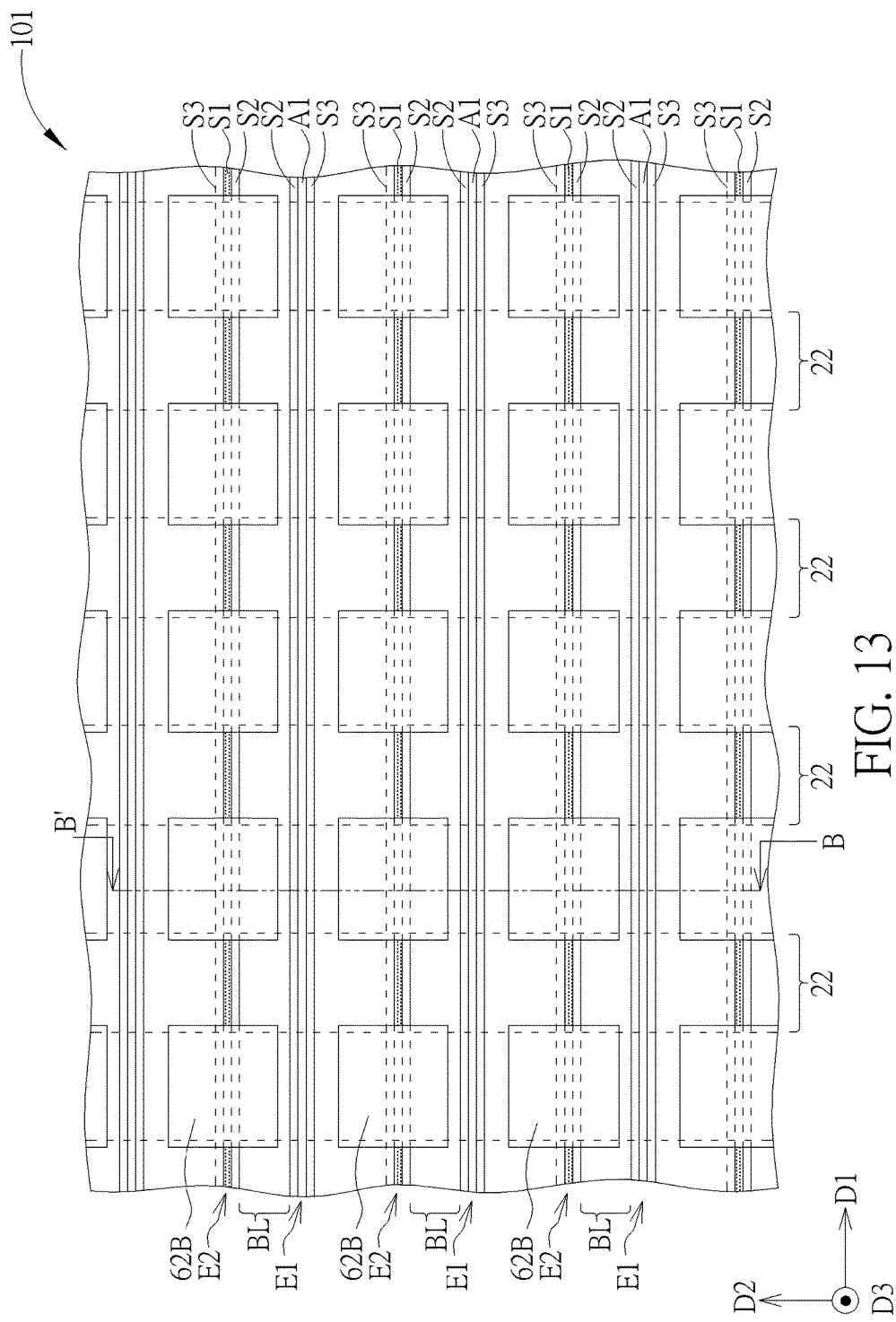

A semiconductor memory device 101 shown in FIGS. 11-13 may be formed by the manufacturing process described above. The semiconductor memory device 101 includes the semiconductor substrate 10, a plurality of the bit line structures BL, a plurality of the storage node contacts 51, a plurality of first air spacers A1, a plurality of first sidewall spacers S1, a plurality of second sidewall spacers S2, and a plurality of third sidewall spacers S3. The bit line structures BL and the storage node contacts 51 are disposed on the semiconductor substrate 10. Each of the bit line structures BL is elongated in the first direction D1, and the bit line structures BL are repeatedly disposed in the second direction D2. In some embodiments, the first direction D1 may be perpendicular to the second direction D2, but not limited thereto. Each of the storage node contacts 51 is disposed between the bit line structures BL adjacent to one another in the second direction D2. Each of the first air spacers A1 is disposed at the first side E1 of each of the bit line structures BL in the second direction D2, and each of the first air spacers A1 is disposed between one of the bit line structures BL and the storage node contact 51 adjacent to the bit line structure BL. Each of the first sidewall spacers S1 is disposed at the second side E2 of each of the bit line structures BL, and the second side E2 is opposite to the first side E1 in the second direction D2. Each of the first sidewall spacers S1 is disposed between one of the bit line structures BL and the storage node contact 51 adjacent to the bit line structure BL. Each of the second sidewall spacers S2 and each of the third sidewall spacers S3 are disposed at the first side E1 and the second side E2 of each of the bit line structures BL. Each of the first sidewall spacers S1 is disposed between one of the second sidewall spacers S2 disposed at the second side E2 and one of the third sidewall spacers S3 disposed at the second side E2. Each of the first air spacers A1 is disposed between one of the second sidewall spacers S2 disposed at the first side E1 and one of the third sidewall spacers S3 disposed at the first side E1. In other words, in some embodiments, the first air spacers A1 may be disposed at only one side of each of the bit line structures BL in the second direction D2, but not limited thereto. Additionally, the semiconductor memory device 101 may further include a plurality of the storage node contact pads 62B. Each of the storage node contact pads 62B is disposed on one of the storage node contacts 51, and each of the storage node contact pads 62B is electrically connected to the corresponding storage node contact 51. The storage node contact pads 62B cover at least a part of the first sidewall spacers S1 in the vertical direction D3. Specifically, the first sidewall spacer S1 disposed at the second side E2 of each of the bit line structures BL is partially covered by the storage node contact pads 62B. The first air spacer A1, the second sidewall spacer S2, and the third sidewall spacer S3 disposed at the first side E1 of each of the bit line structures BL are not covered by the storage node contact pads 62B. Each of the first air spacers A1 is elongated in the first direction D1, and a length of each of the first air spacers A1 in the first direction D1 is longer than a length of each of the storage node contact pads 62B in the first direction D1. In some embodiments, the length of each of the first air spacers A1 in the first direction D1 may be larger than double or triple the length of each of the storage node contact pads 62B in the first direction D1.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 14:
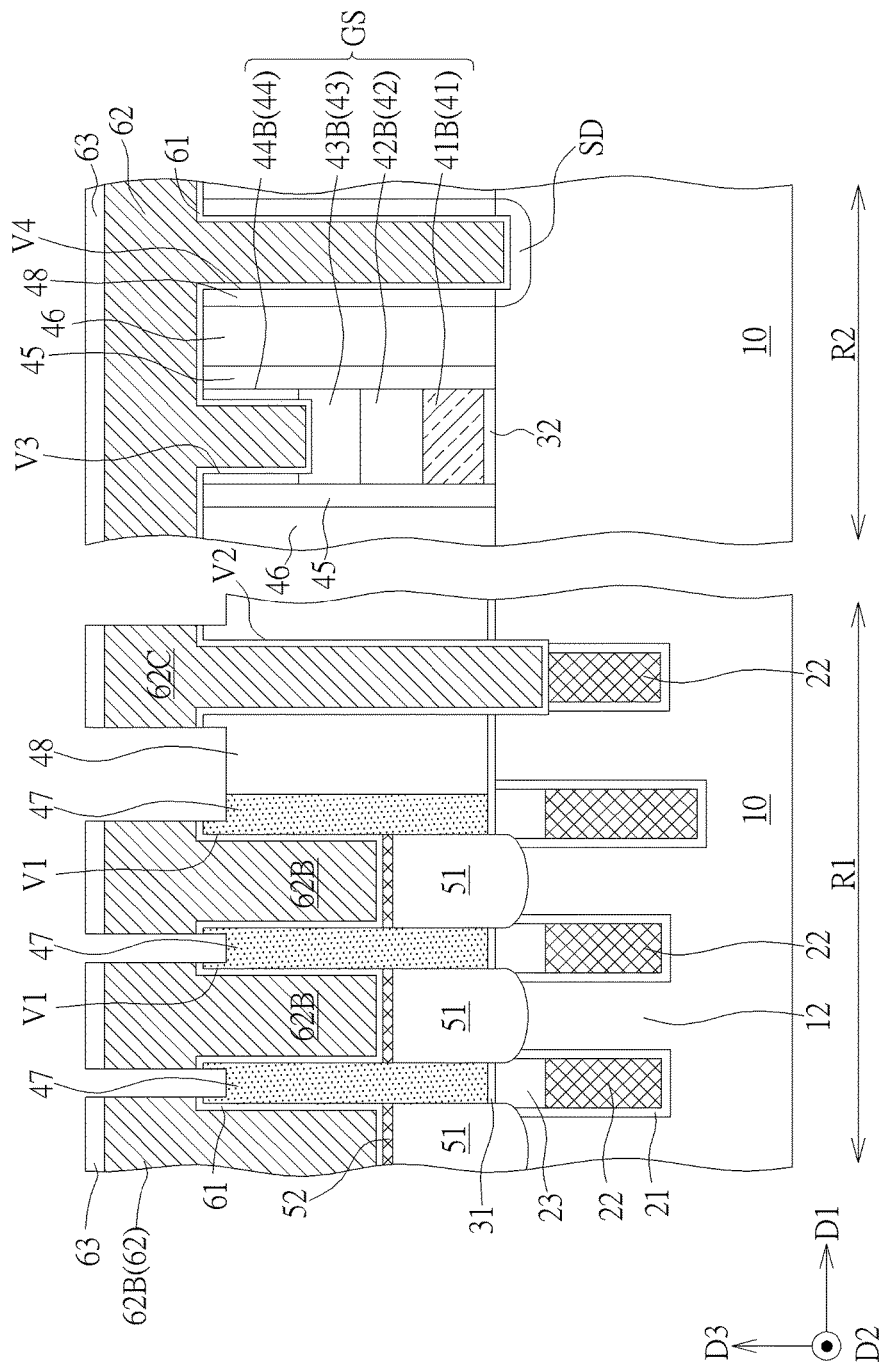
FIG. 14 is a schematic drawing illustrating a manufacturing method of a semiconductor memory device according to a second embodiment of the present invention.

Please refer to FIG. 14 and FIG. 11. FIG. 14 is a schematic drawing illustrating a manufacturing method of a semiconductor memory device according to a second embodiment of the present invention, and FIG. 11 may be regarded as a schematic drawing in a step subsequent to FIG. 14. As shown in FIG. 14 and FIG. 11, the difference between the manufacturing method in this embodiment and the manufacturing method in the first embodiment mentioned above is that, in this embodiment, the conductive layer 62 disposed on the gate structure GS and the source/drain region SD are patterned for forming the gate contact structure 62G and the source/drain contact structure 62S after the first patterning process described above.

Figure 15:
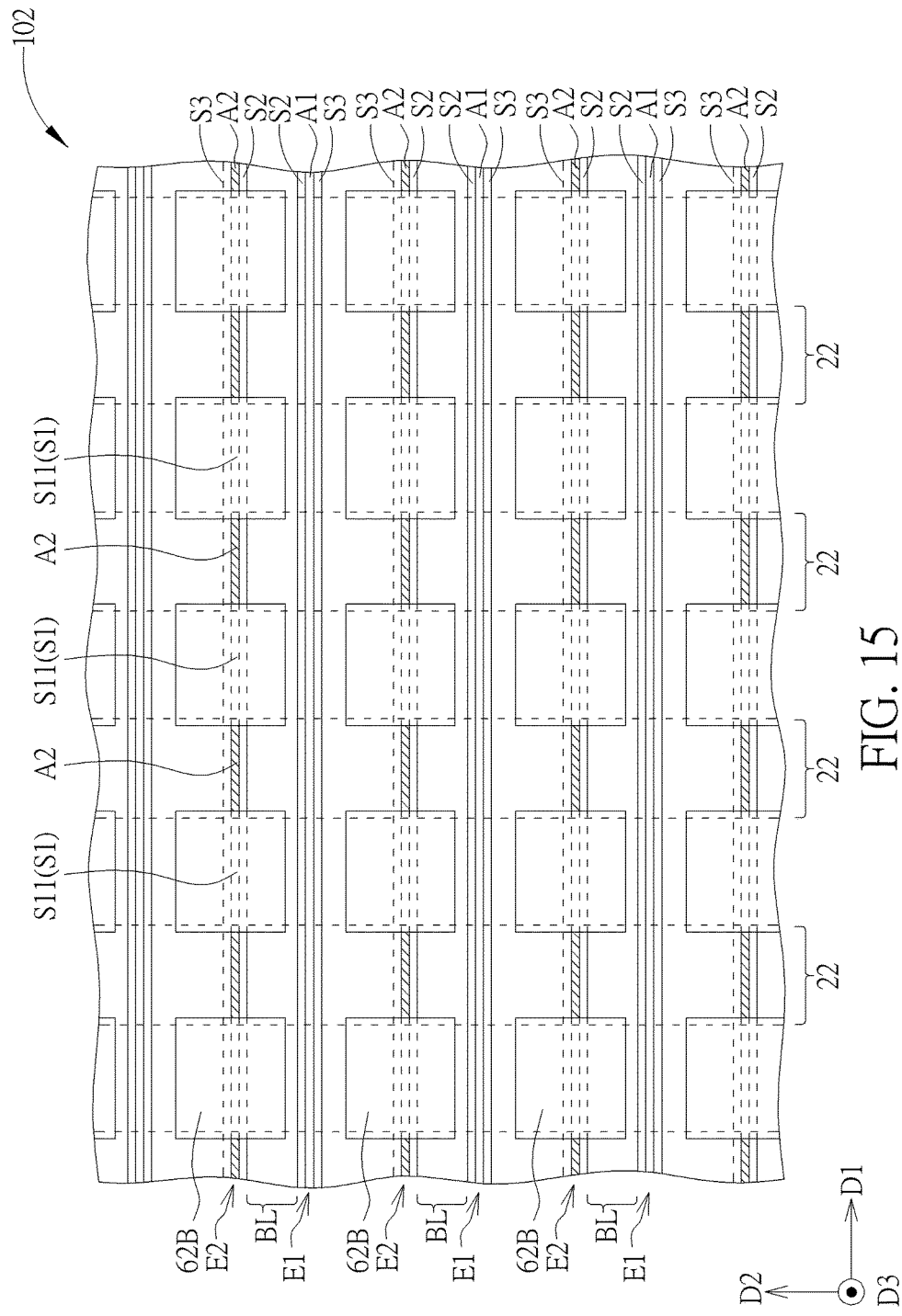
FIG. 15 is a schematic drawing illustrating a manufacturing method of a semiconductor memory device according to a third embodiment of the present invention.

Please refer to FIG. 15 and FIG. 13. FIG. 15 is a schematic drawing illustrating a manufacturing method of a semiconductor memory device 102 according to a third embodiment of the present invention. FIG. 15 may be regarded as a schematic drawing in a step subsequent to FIG. 13. As shown in FIG. 13 and FIG. 15, the difference between the manufacturing method in this embodiment and the manufacturing method in the first embodiment mentioned above is that, after the step of forming the storage node contact pads 62B, the first sidewall spacer S1 which is formed at the second side E2 of each of the bit line structures BL and is not covered by the storage node contact pads 62B may be removed for forming a plurality of second air spacers A2. At least apart of the second air spacers A2 are repeatedly disposed in the first direction D1, and a part of the first sidewall spacer S1 is disposed between the second air spacers A1 adjacent to one another in the first direction D1. A length of each of the second air spacers A2 in the first direction D1 is shorter than the length of each of the first air spacers A1 in the first direction D1 because the first sidewall spacer S1 disposed at the second side E2 of each of the bit line structures BL is partially covered by the storage node contact pads 62B. Additionally, the first sidewall spacer S1 is divided into a plurality of fifth sidewall spacers S11 arranged in the first direction by the second air spacers A2. A length of each of the fifth sidewall spacers S11 in the first direction D1 may be equal to or shorter than the length of each of the storage node contact pads 62B in the first direction D1. Compared with the first embodiment, the semiconductor memory device 102 in this embodiment may further include a plurality of the second air spacers A2. Each of the second air spacers A2 is disposed at the second side E2 of each of the bit line structures BL, and each of the second air spacers A2 is disposed between one of the second sidewall spacers S2 disposed at the second side E2 and one of the third sidewall spacers S3 disposed at the second side E2. Additionally, in the top view diagram of the semiconductor memory device 102, each of the storage node contact pads 62 is at least partially disposed between the second air spacers A2 adjacent to one another in the first direction D1. The second air spacers A2 may be used to further reduce the parasite capacitance of the bit line structures BL, and the operation performance of the semiconductor memory device 102 may be further improved accordingly.

To summarize the above descriptions, according to the semiconductor memory device and the manufacturing method thereof in the present invention, the first sidewall spacer disposed at one side of each of the bit line structures may be removed for forming the air spacers before the step of forming the storage node contact pads. The etching process may be used to remove the first sidewall spacer formed at the first side of each of the bit line structures effectively and form the required air spacers because the first sidewall spacer formed at the first side of each of the bit line structures is not covered by the stripe contact structures or the storage node contact pads. When the sidewall spacer is partially covered by other components in a wet etching process and the sidewall spacer has to be etched by side etching effect of the wet etching process for forming the air spacer, there will be some problems such as under etching and/or longer etching time, and these problems may be avoided by the manufacturing method of the present invention. The purposes of enhancing manufacturing yield and improving device operation performance may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a semiconductor substrate;
   a plurality of bit line structures disposed on the semiconductor substrate, wherein each of the bit line structures is elongated in a first direction, and the bit line structures are repeatedly disposed in a second direction;
   a plurality of storage node contacts disposed on the semiconductor substrate, wherein each of the storage node contacts is disposed between the bit line structures adjacent to one another in the second direction, and some of the storage node contacts are repeatedly arranged in the first direction;
   a plurality of first air spacers, wherein each of the first air spacers is disposed at a first side of each of the bit line structures in the second direction, and each of the first air spacers is disposed between one of the bit line structures and the storage node contact adjacent to the bit line structure;
   a plurality of first sidewall spacers, each of the first sidewall spacers is disposed at a second side of each of the bit line structures which is opposite to the first side in the second direction, and each of the first sidewall spacers is disposed between one of the bit line structures and the storage node contact adjacent to the bit line structure;
   a plurality of second sidewall spacers and a plurality of third sidewall spacers, wherein each of the second sidewall spacers and each of the third sidewall spacers are disposed at the first side and the second side of each of the bit line structures, each of the first sidewall spacers is disposed between one of the second sidewall spacers disposed at the second side and one of the third sidewall spacers disposed at the second side, and each of the first air spacers is disposed between one of the second sidewall spacers disposed at the first side and one of the third sidewall spacers disposed at the first side; and
   a plurality of storage node contact pads, wherein each of the storage node contact pads is disposed on one of the storage node contacts, and each of the storage node contact pads is electrically connected to the corresponding storage node contact, wherein each of the first sidewall spacers disposed at the second side of each of the bit line structures is at least partially covered by the storage node contact pads.

2. The semiconductor memory device according to claim 1, wherein each of the first sidewall spacer comprises an oxide spacer, and each of the second sidewall spacers and each of the third sidewall spacers comprise a nitride spacer respectively.

3. The semiconductor memory device according to claim 1, wherein each of the first air spacers is elongated in the first direction.

4. The semiconductor memory device according to claim 1, further comprising:

a plurality of second air spacers, wherein each of the second air spacers is disposed at the second side of each of the bit line structures, and each of the second air spacers is disposed between one of the second sidewall spacers disposed at the second side and one of the third sidewall spacers disposed at the second side, wherein at least a part of the second air spacers are repeatedly disposed in the first direction, and a part of each of the first sidewall spacers is disposed between the second air spacers adjacent to one another in the first direction.

5. The semiconductor memory device according to claim 4, wherein a length of each of the second air spacers in the first direction is shorter than a length of each of the first air spacers in the first direction.

6. The semiconductor memory device according to claim 4, further comprising:
a plurality of storage node contact pads, wherein each of the storage node contact pads is disposed on one of the storage node contacts, and each of the storage node contact pads is electrically connected to the corresponding storage node contact, wherein each of the storage node contact pads is at least partially disposed between the second air spacers adjacent to one another in the first direction.

* * * * *

UNITED STATES PATENT AND TRADEMARK OFFICE
CERTIFICATE OF CORRECTION

PATENT NO. : 10,361,209 B2
APPLICATION NO. : 16/043166
DATED : July 23, 2019
INVENTOR(S) : Ying-Chiao Wang et al.

Page 1 of 1

It is certified that error appears in the above-identified patent and that said Letters Patent is hereby corrected as shown below:

On the Title Page

Item (71), correct the address of the 2nd applicant from "Quanzhou, Fujan Province (CN)" to --Quanzhou, Fujian Province (CN)--.

Signed and Sealed this
Tenth Day of September, 2019

Andrei Iancu
*Director of the United States Patent and Trademark Office*